(12) United States Patent
Ha

(10) Patent No.: US 7,993,802 B2
(45) Date of Patent: Aug. 9, 2011

(54) METHOD FOR CORRECTING PATTERN CRITICAL DIMENSION IN PHOTOMASK

(75) Inventor: Tae Joong Ha, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 131 days.

(21) Appl. No.: 12/473,366

(22) Filed: May 28, 2009

(65) Prior Publication Data

US 2010/0003607 A1   Jan. 7, 2010

(30) Foreign Application Priority Data

Jul. 2, 2008 (KR) .................. 10-2008-0064037

(51) Int. Cl.
*G03F 1/00* (2006.01)
(52) U.S. Cl. ........................................... 430/5; 438/706
(58) Field of Classification Search ................ 430/5, 30, 430/296; 438/706
See application file for complete search history.

(56) References Cited

U.S. PATENT DOCUMENTS

2006/0019174 A1   1/2006   Ahn et al.
2006/0147818 A1 *  7/2006   Lee .................................. 430/5
2008/0044742 A1 *  2/2008   Jung et al. ....................... 430/5
2009/0253052 A1 * 10/2009   Ha .................................. 430/5

FOREIGN PATENT DOCUMENTS

| JP | 11-202475 A | 7/1999 |
| KR | 10-2006-007777 | 1/2006 |
| KR | 10-2006-0070356 | 6/2006 |
| KR | 10-2006-0104825 | 10/2006 |

* cited by examiner

*Primary Examiner* — Mark F Huff
*Assistant Examiner* — Stewart A Fraser
(74) *Attorney, Agent, or Firm* — Marshall, Gerstein & Borun LLP

(57) ABSTRACT

A method for correcting pattern critical dimension (CD) in a photomask includes forming a multilayer structure over a substrate by stacking at least two thin films capable of forming a compound by application of energy from an energy source; forming a light-shielding layer over the multilayer structure; forming a light-shielding layer pattern that selectively exposes the multilayer structure by selectively etching the light-shielding layer; detecting a correction region requiring a CD correction by measuring a CD of the light-shielding layer pattern; and forming a compound, by which the CD is corrected by a transmittance difference between the multilayer structure and the correction region, by applying an energy to a region of the multilayer structure corresponding to the detected correction region to react the thin films.

18 Claims, 6 Drawing Sheets

METHOD FOR CORRECTING PATTERN CRITICAL DIMENSION IN PHOTOMASK

CROSS-REFERENCE TO RELATED APPLICATION

Priority to Korean patent application number 10-2008-0064037, filed on Jul. 2, 2008, the entire disclosure of which is incorporated by reference in its entirety, is claimed.

BACKGROUND OF THE INVENTION

The invention relates to a method for fabricating a photomask and, more particularly, to a method for correcting a pattern critical dimension (CD) in a photomask.

In a process of fabricating a semiconductor device, a photomask formed with a pattern is used to realize a pattern to be formed in a wafer. Since the pattern formed over the photomask is transferred onto the wafer, the method of fabricating the photomask is very important.

As the degree of integration degree of semiconductors has increased, the size of patterns forming the semiconductor device have become increasingly miniaturized. Accordingly, the patterns formed over the photomask have a finer CD. In the fabrication of the photomask, a light-shielding layer and a first resist layer are first formed, and an exposure process and a development process are performed on the first resist layer to form a first resist layer pattern. An exposed portion of the light-shielding layer is etched using the first resist layer pattern as an etch mask to form a light-shielding layer pattern, and the first resist layer pattern is then removed.

However, in the fabrication process of the photomask, some of the patterns can be formed relatively larger or smaller than a CD to be formed due to an insufficient etch margin, a defect of a process apparatus, and the like. As such, the mask pattern having CD difference from the target CD is transferred as it is to thereby result in a defect in wafer patterns.

SUMMARY OF THE INVENTION

In one embodiment, a method for correcting pattern CD in a photomask includes forming a multilayer structure over a substrate, the multilayer structure being formed by stacking at least two thin films capable of forming a compound by application of energy from an energy source; forming a light-shielding layer over the multilayer structure; forming a light-shielding layer pattern that selectively exposes the multilayer structure by selectively etching the light-shielding layer; detecting a correction region requiring a CD correction by measuring a CD of the light-shielding layer pattern; and forming a compound, by which the CD is corrected by a transmittance difference between the multilayer structure and the correction region, by applying energy to a region of the multilayer structure corresponding to the detected correction region to react the thin films.

In another embodiment, a method for correcting pattern CD in a photomask includes forming a multilayer structure over a substrate, the multilayer structure being formed by stacking at least two thin films capable of forming a compound by application of energy from an energy source; forming a phase-shift layer and a light-shielding layer over the multilayer structure; forming a light-shielding layer pattern that selectively exposes the phase-shift layer by selectively etching the light-shielding layer; forming a phase-shift layer pattern by etching a portion of the phase-shift layer exposed by the light-shielding layer; exposing the phase-shift layer pattern over a portion of the substrate by selectively removing the light-shielding layer pattern; detecting a correction region requiring a CD correction by measuring a CD of the exposed phase-shift layer pattern; and forming a compound, by which the CD is corrected by a transmittance difference between the multilayer structure and the correction region, by applying energy to a region of the multilayer structure corresponding to the detected correction region to react the thin films.

In a further embodiment, a method for correcting pattern CD in a photomask includes forming a multilayer structure over a substrate, the multilayer structure being formed by stacking at least two thin films of which transmittance is varied by application of energy from an energy source; forming a mask layer over the multilayer structure; forming a mask layer pattern that selectively exposes the multilayer structure by selectively etching the mask layer; detecting a correction region requiring a CD correction by measuring the CD of the mask layer pattern; and correcting the CD by a transmittance difference between the multilayer structure and the correction region, by selectively irradiating with a laser beam any one of the thin films included in the multilayer structure so that the transmittance of the portion of the multilayer structure corresponding to that of the detected correction region.

DESCRIPTION OF SPECIFIC EMBODIMENTS

Figure 1:
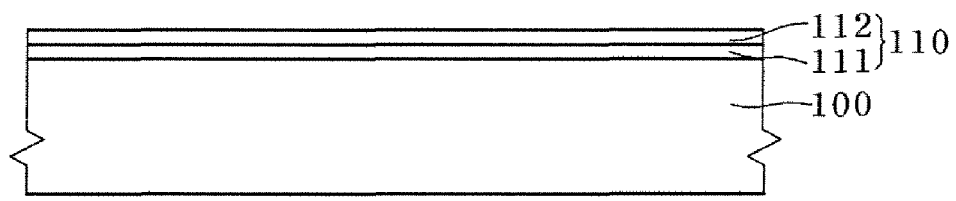
FIGS. 1 through 11 illustrate a method for correcting pattern CD in a photomask in accordance with an embodiment of the invention.

Referring to FIG. 1, a multilayer structure 110 formed by stacking at least two thin films capable of forming a compound by an energy source is formed over a transparent substrate 100, such as quartz, for example. The transparent substrate 100 includes a main region on which a phase shift pattern to be subsequently formed is disposed to shift a phase of light transmitted therethrough and a frame region on which a light-shielding layer is disposed to shield unnecessary light.

The multilayer structure 110 preferably is formed by controlling thicknesses of the thin films so that a transmittance of the light transmitted through the multilayer structure 110 is at least 50%. For example, in a case of a chromium layer, a transmittance of the chromium layer is 0% when the chromium layer is formed to a thickness of 590 Å. In contrast, the transmittance of the chromium layer is 90% when the chromium layer is formed to a thickness of 53 Å. As such, since the transmittance varies with the thickness of the thin film, the multilayer structure 110 formed by stacking two or more thin films preferably is formed by controlling the thicknesses of the respective thin films so that the multilayer structure film 110 has a desired transmittance. Particularly, in a case of the thin film included in the multilayer structure 110, it is possible to control the transmittance of the thin film through partial oxidation of the thin film. For example, deposition of a thin film over the transparent substrate 100 and additionally oxidizing the deposited thin film is capable of increasing the transmittance of the deposited thin film.

The multilayer structure 110 preferably is formed by stacking metal layers, for example, material layers selected from the group consisting of zirconium, gallium, indium, tin, titanium, aluminum, and bismuth. Such material layers can form a compound by application thereto of energy from an energy source and the thin films react with each other to form a compound when applied energy exceeds a eutectic point of the thin films.

For example, the multilayer structure 110 can be formed by stacking a bismuth layer 111 and an indium layer 112. In the present embodiment, the multilayer structure 110 is formed by stacking the bismuth layer 111 and the indium layer 112 for convenience, but the multilayer structure 110 is not limited thereto.

Figure 2:
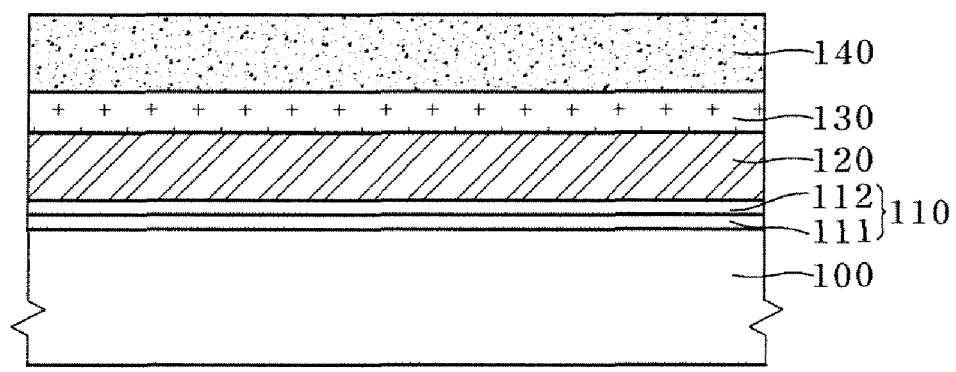

Referring to FIG. 2, a phase-shift layer 120, a light-shielding layer 130, and a first resist layer 140 are formed over the multilayer structure 110. The phase-shift layer 120 preferably comprises a material, e.g. a molybdenum silicon oxide (Mo-SiO) layer, capable of shifting a phase of the transmitted light. The light-shielding layer 130 preferably comprises a material layer, e.g. a chromium (Cr) layer, capable of shielding the transmitted light. The phase-shift layer 120 preferably is formed to a thickness capable of shifting the phase of the transmitted light by controlling the thickness of the phase-shift layer 120 according to the transmittance of the multilayer structure 110.

Meanwhile, a hard mask layer preferably is formed in an interface between the light-shielding layer 130 and the first resist layer 140. The hard mask layer preferably comprises a carbon layer, e.g. a carbon layer formed by spin-on-carbon coating.

Figure 3:
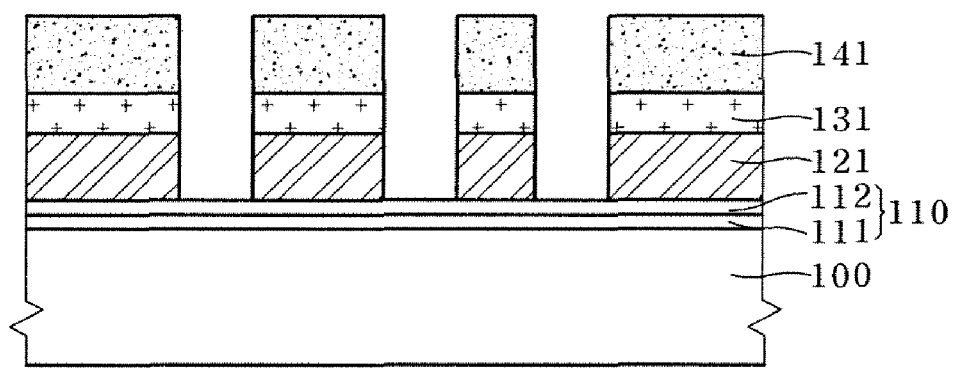

Referring to FIG. 3, a lithography process is performed on the first resist layer (140 in FIG. 2) to form a first resist layer pattern 141 that selectively exposes the light-shielding layer. Preferably, any suitable exposure process using an electron beam is performed on the first resist layer 140 and a development process using a development solution is then performed on the exposed resist layer. Then, the first resist layer 140 is selectively removed by a solubility difference between the exposed portion and the non-exposed portion to form a first resist layer pattern 141 that selectively exposes the light-shielding layer.

The exposed portion of the light-shielding layer and the corresponding portion of the phase-shift layer under the exposed portion of the light-shielding layer are etched using the first resist layer pattern 141 as an etch mask to form a light-shielding layer pattern 131 and a phase-shift layer pattern 121. The light-shielding layer pattern 131 and the phase-shift layer pattern 121 preferably are formed by performing a dry etch process having a good straightness Meanwhile, to form the light-shielding layer pattern 131 and the phase-shift layer pattern 121, the exposed portion of the light-shielding layer is etched using the first resist layer pattern 141 as an etch mask to form a light-shielding layer pattern 131, and the resulting exposed portion of the phase-shift layer is subsequently etched to form the phase-shift layer pattern 121 that exposes the multilayer structure 110. Otherwise, it is possible that the light-shielding layer pattern 131 is formed using the first resist layer pattern 141 as an etch mask, the first resist layer pattern is removed by performing a strip process, and the exposed portion of the phase-shift layer is then etched using the light-shielding layer pattern 131 as an etch mask to form the phase-shift layer pattern 121.

Figure 4:
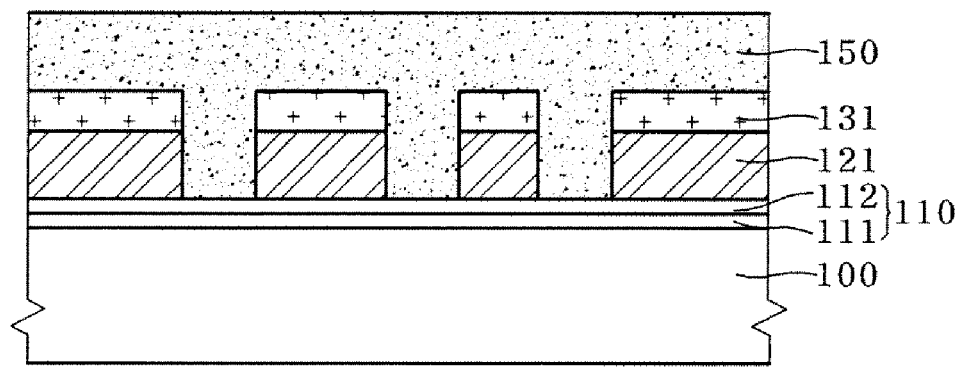

Referring to FIG. 4, the first resist layer pattern (141 in FIG. 3) is removed by performing a strip process and a second resist layer 150 is then formed over the multilayer structure 110 formed with the light-shielding layer pattern 131 and the phase-shift layer pattern 121. The second resist layer pattern 150 is patterned in a subsequent process and functions as an etch mask for selectively removing the light-shielding layer pattern 131 formed in the main region of the transparent substrate.

Figure 5:
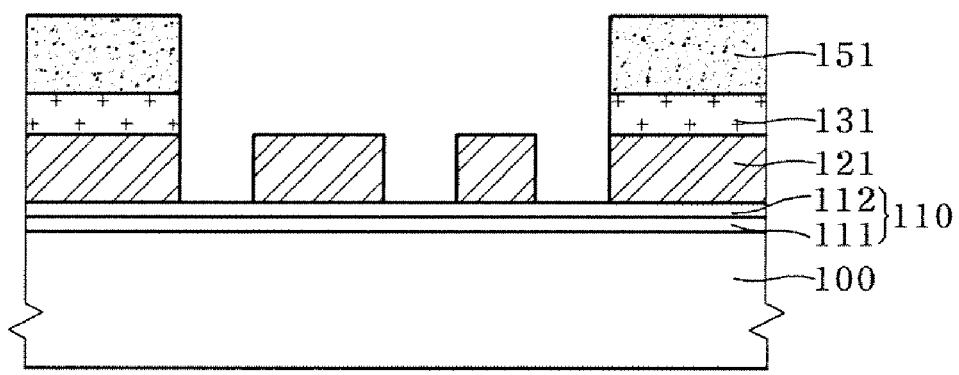

Referring to FIG. 5, a lithography process is performed on the second resist layer (150 in FIG. 4) to form a second resist layer pattern 151 that exposes the main region of the transparent substrate 100. For example, any suitable exposure process using an electron beam may performed on the second resist layer 150 and a development process using a development solution is then performed on the exposed resist layer 150. Then, the second resist layer 150 is selectively removed by a solubility difference between the exposed portion and the non-exposed portion to form a second resist layer pattern 151. Here, the second resist layer pattern 151 is formed so that the light-shielding layer pattern for shielding an incidence of unnecessary light is selectively removed in a subsequent process and the main region on which only the phase-shift layer pattern for shifting the phase of the transmitted light is disposed is thus selectively exposed.

The light-shielding layer pattern 131 in the main region exposed by the second resist layer pattern 151 is selectively removed. Then, only the phase-shift layer pattern 121 remains in the main region of the transparent substrate 100 and both the phase-shift layer pattern 121 and the light-shielding layer pattern 131 remain in the frame region of the transparent substrate 100.

Figure 6:
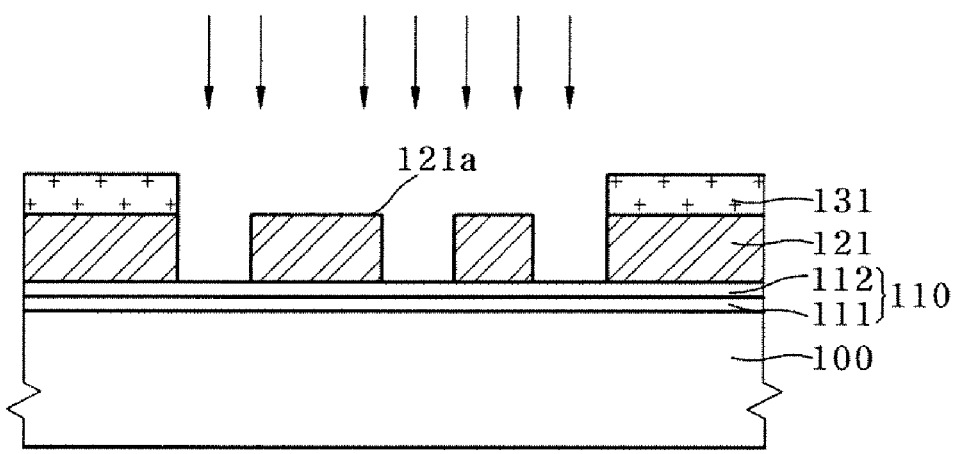

Referring to FIG. 6, the second resist layer pattern (151 in FIG. 5) is removed by performing a strip process. Next, a critical dimension (CD) of the phase-shift layer pattern 121 is measured using a CD measuring apparatus and a region requiring CD correction is then detected.

For example, in the process of fabricating the phase shift mask, patterns 121a with a CD defect (wherein the CD of the phase-shift layer pattern 131 is relatively larger than a CD of the target pattern to be formed) can be formed. The patterns 121a with a CD defect can be formed with different CDs by positions in the transparent substrate 100. Such patterns 121a with CD defect are transferred onto a wafer by a subsequent wafer exposure process and thus cause a wafer defect.

Therefore, when the patterns 121a with a CD defect are generated after the phase shift mask if formed, it is necessary to discard the mask and re-fabricate the mask. Also, although it is possible to perform a process of correcting the patterns 121a with a CD defect, it is necessary to use a separate correction mask and process time and process cost are thus increased by resist coating, exposure, and etch processes according to the separate correction mask, thereby lowering yield. Also, when the patterns 121a with a CD defect are formed with different CDs by positions, the process time and cost are increased and it is difficult to meet the exact correction amount, since it is necessary to vary a correction amount by positions. Therefore, following processes are performed in the present embodiment of the invention.

Figure 7:
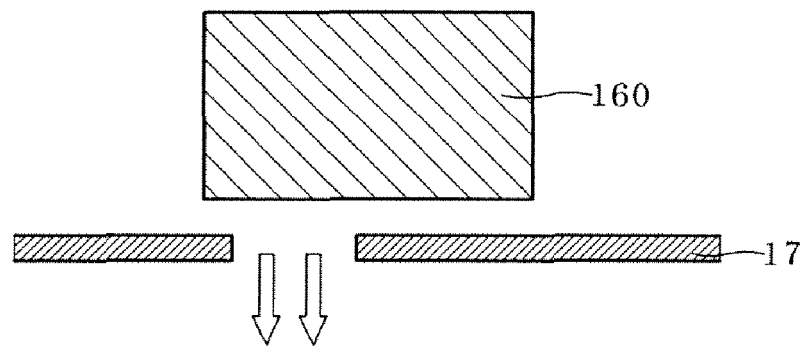
Figure 7:
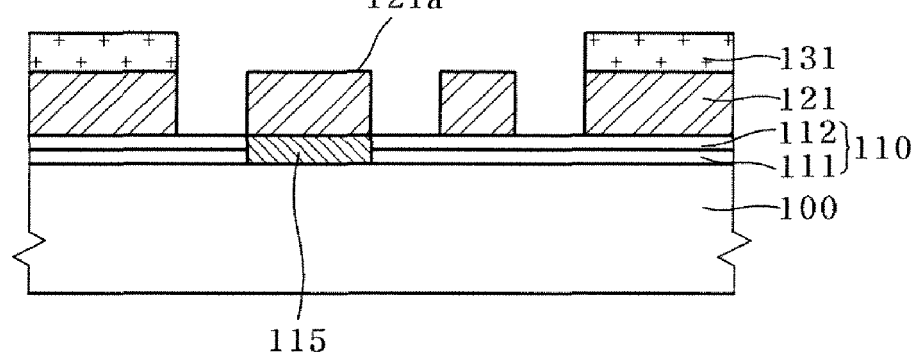

Referring to FIG. 7, by selectively applying energy to the portion of the multilayer structure 110 corresponding to the region requiring CD correction due to the patterns 121a with the CD defect, the at least two thin films, e.g. the bismuth layer 111 and the indium layer 112, included in the multilayer structure 110 react with each other to form a compound 115. Preferably, to form the bismuth-indium compound, the energy can be applied to the bismuth layer 111 and the indium layer 112 using a laser beam or a heat radiation plate.

Specifically, a laser beam 160 is irradiated to the portion of the multilayer structure 110 corresponding to the region requiring CD correction using an aperture 170 that opens the portion of the multilayer structure 110 corresponding to the region requiring CD correction. The laser beam 160 can be irradiated to an upper face formed with the phase-shift layer pattern 121 or a back side of the substrate, for example. Then, the bismuth layer 111 and the indium layer 112 receive the energy from the laser beam 160 and react with each other to form the compound 115. Such compound 115 is selectively formed only in the region of the multilayer structure corresponding to the patterns 121*a* with the CD defect to increase the transmittance of the light transmitted through the patterns 121*a* with the CD. Therefore, it is possible to correct the pattern formed over the wafer without performing the CD correction process.

Meanwhile, it is possible to selectively apply the laser only to the single thin film in the portion of the multilayer structure 110 corresponding to the region requiring CD correction to thereby vary the transmittance of the single thin film. For example, it is possible to selectively apply the laser only to the bismuth layer included in the multilayer structure to vary only the transmittance of the bismuth layer or it is possible to selectively apply the laser only to the indium layer included in the multilayer structure to vary only the transmittance of the indium layer.

Figure 9:
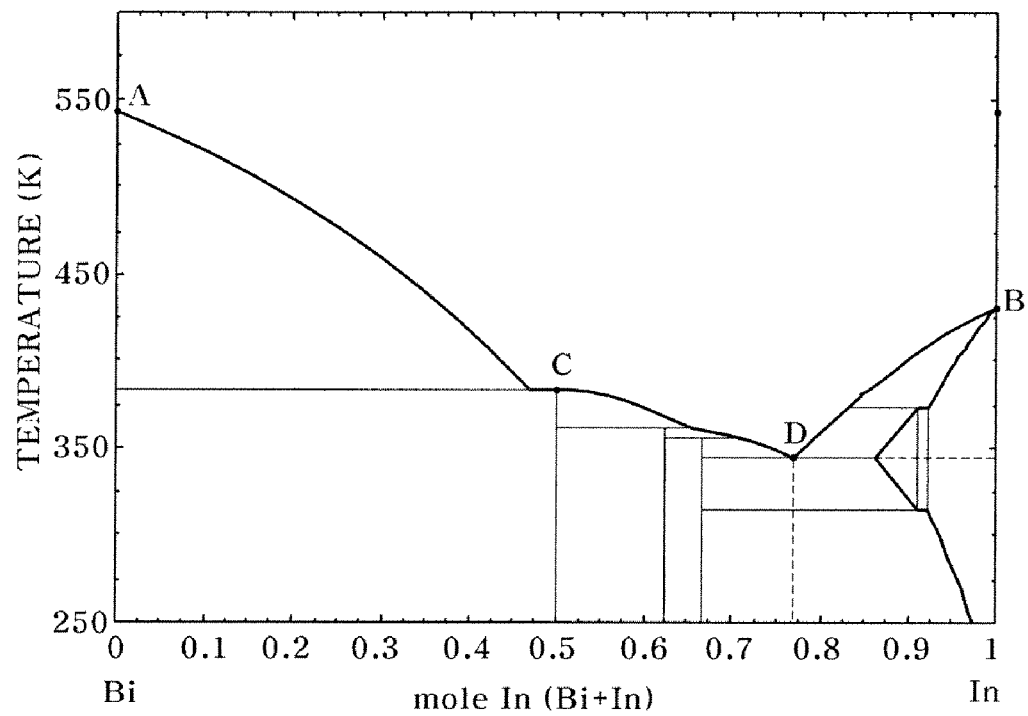

FIG. 9 is a graph showing a eutectic point between the bismuth and the indium. Referring to FIG. 9, a melting point of the bismuth is present at a point (A), e.g. about 500 degrees K when the bismuth is 100 mass % and a melting point of the indium is present at a point (B), e.g. about 430 degrees K when the indium is 100 mass %. Here, when the bismuth is 50 mass % and the indium is 50 mass %, a eutectic point between the bismuth and the indium is present at a point (C). Particularly, a minimum eutectic point according to the ratio of the bismuth and the indium is present at a point (D). Also, in a case of a thin film formed by stacking the bismuth layer and the indium layer or a thin film formed by mixing the bismuth and the indium, the eutectic point between the bismuth and the indium is lower than when each thin film is 100 mass %. Therefore, according to mass ratio of the bismuth layer and the indium layer, the bismuth layer and the indium layer react with each other when the energy over the eutectic point is applied and the compound can be selectively formed in the portion to which the energy is applied.

Figure 10:
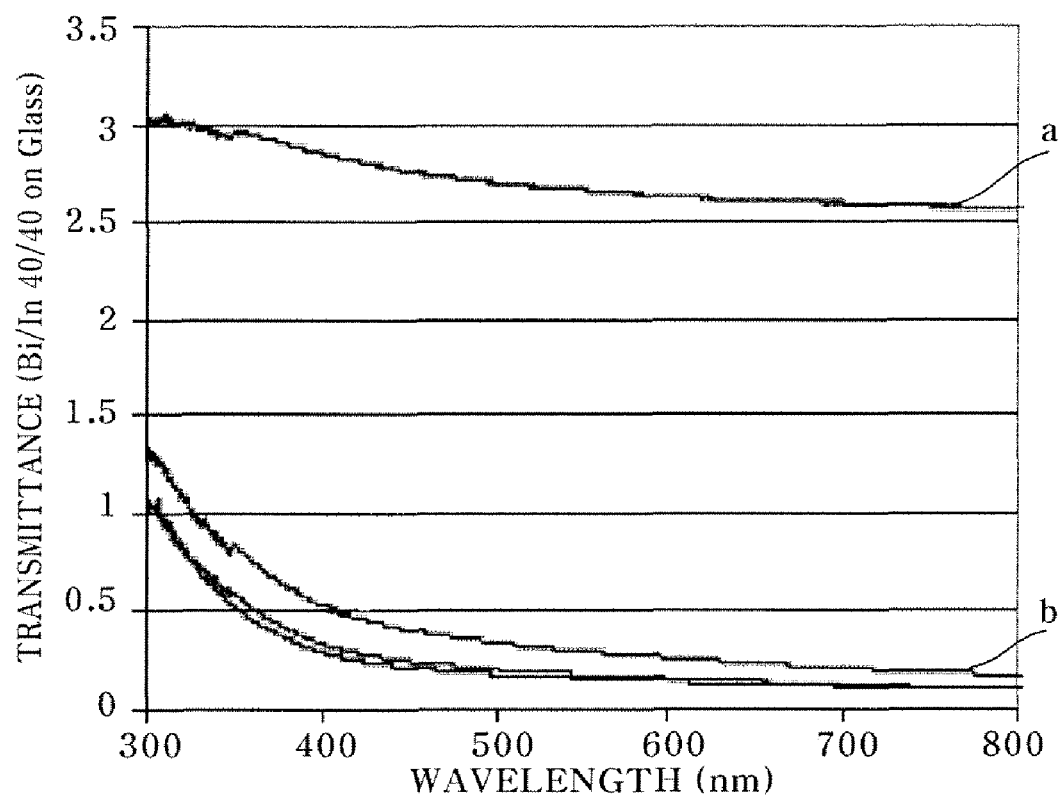

FIG. 10 is a graph illustrating a result of measuring transmittances of the bismuth layer and the indium layer when forming the bismuth layer to the thickness of 40 nm and forming the indium layer to the thickness of 40 nm. As shown in FIG. 10, a transmittance index (a) measured after stacking the bismuth layer and the indium layer is 3 to 2.5, whereas the transmittance index (b) of the compound formed by applying energy of 300 mW to the bismuth layer and the indium layer is 1.3 to 0.2. Here, the transmittance index is represented lower when the transmittance is higher, and the transmittance index is 0 when the transmittance is 100%. Therefore, it can be appreciated that the transmittance of the compound formed by the reaction of the two thin films is increased as compared to the transmittance when stacking the bismuth layer and the indium layer.

Figure 11:
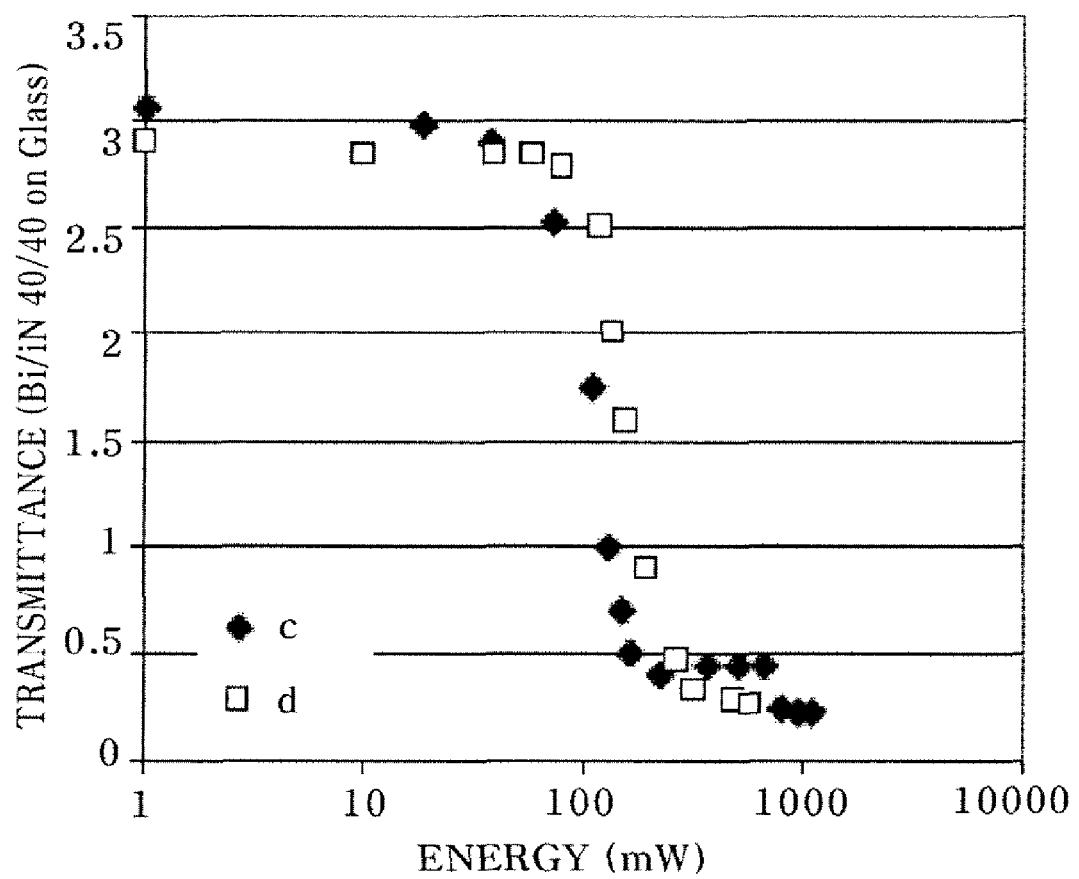

FIG. 11 is a graph illustrating the result of measuring the transmittance of the compound with varying the energy power applied to the multilayer structure. As shown in FIG. 11, in the compound (c) formed after stacking the bismuth layer and the indium layer, the transmittance index is lowered as the energy power is increased. Further, in the compound (d) formed after stacking a tin layer and the indium layer, the transmittance index is lowered as the energy power is increased. In other words, the transmittance of the compound formed by the reaction of the two thin films is varied as the energy power and the transmittance of the compound is increased as the energy power is increased.

As such, a transmittance difference is generated between the region in which the bismuth layer and the indium layer are sequentially stacked and the region in which the compound is formed by application of the energy. Therefore, it is possible to convert the CD correction amount of the CD of the pattern with a defect CD to the CD of the target pattern to be formed into a transmittance and determine the forming degree of the compound according to the CD correction amount using the converted transmittance. Also, when the patterns with a CD defect are formed with different CDs by the positions in the photomask, it is possible to correct the CDs by controlling the transmittances by the positions.

Figure 8:
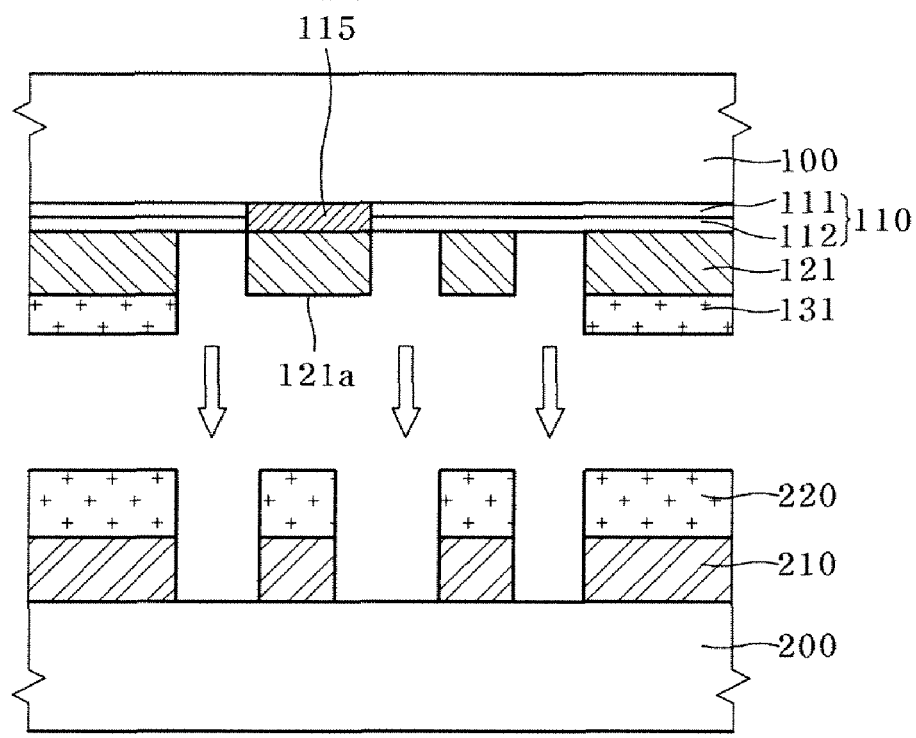

Referring to FIG. 8, a wafer exposure process is performed using the phase shift mask formed with the compound 115 in the CD correction region by the CD correction amount. Then, the light transmitted through the phase shift mask is transferred to the resist layer 220 of the wafer with a quantity of the light transmitted through the region formed with the compound being increased more than that through the region formed as a target pattern.

In other words, the light transmitted through the region formed with the phase-shift layer pattern 121 with the target CD is transferred onto the resist layer 220 of the wafer 220 formed with an etch target layer 210 with the same CD, and the light transmitted through the region formed with the compound 115 is transferred with a CD narrower than the CD of the pattern 121*a* with the CD defect as the light quantity is increased by the compound, thereby performing the CD correction. Accordingly, a resist layer pattern having the same CD as the phase-shift layer pattern 121 formed over the phase-shift layer is formed and the etch target layer pattern formed over the wafer is also formed with the same CD, thereby capable of enhancing pattern uniformity.

As is apparent from the above description, a multilayer structure including at least two thin films is formed in the photomask fabrication process, and then fabrication of a final photomask is completed. After that, an actual CD of the mask pattern is measured and the an energy over a eutectic point is applied to the multilayer structure by the correction regions to form a compound, thereby capable of correcting the CD of the mask pattern to the CD of the target pattern. Therefore, it is possible to control the pattern CD more accurately.

While the invention has been described with respect to the specific embodiments, various changes and modifications may be made without departing from the spirit and scope of the invention as defined in the following claims.

What is claimed is:

1. A method for correcting a pattern critical dimension (CD) in a photomask, comprising:
    forming a multilayer structure over a substrate by stacking at least two thin films capable of reacting with each other to form a compound by application of energy from an energy source;
    forming a light-shielding layer over the multilayer structure;
    forming a light-shielding layer pattern that selectively exposes the multilayer structure by selectively etching the light-shielding layer;
    detecting a correction region requiring a CD correction by measuring a CD of the light-shielding layer pattern; and
    forming a compound, by which the CD is corrected by a transmittance difference between the multilayer structure and the correction region, by applying energy to a region of the multilayer structure corresponding to the detected correction region to react the thin films.

2. The method of claim 1, further comprising forming a hard mask layer over the light-shielding layer.

3. The method of claim 1, comprising forming the multilayer structure by controlling thicknesses of the thin films so that transmittance of light transmitted through the multilayer structure is at least 50%.

4. The method of claim 1, comprising controlling transmittance of the multilayer structure by forming and oxidizing at least one of the thin films.

5. The method of claim 1, comprising forming the multilayer structure by stacking material layers selected from the group consisting of zirconium, gallium, indium, tin, titanium, aluminum, and bismuth.

6. The method of claim 1, comprising forming the compound by irradiating the region of the multilayer structure corresponding to the detected correction region with a laser beam or by applying thermal energy to the region of the multilayer structure corresponding to the detected correction region using a heat radiation plate.

7. The method of claim 6, comprising irradiating an upper face or a back side of the substrate with the laser beam.

8. A method for correcting a critical dimension (CD) in a photomask, comprising:
    forming a multilayer structure over a substrate by stacking at least two thin films capable of reacting with each other to form a compound by application of energy from an energy source;
    forming a phase-shift layer and a light-shielding layer over the multilayer structure;
    forming a light-shielding layer pattern that selectively exposes the phase-shift layer by selectively etching the light-shielding layer;
    forming a phase-shift layer pattern by etching a portion of the phase-shift layer exposed by the light-shielding layer;
    exposing the phase-shift layer pattern over a portion of the substrate by selectively removing the light-shielding layer pattern;
    detecting a correction region requiring a CD correction by measuring a CD of the exposed phase-shift layer pattern; and
    forming a compound, by which the CD is corrected by a transmittance difference between the multilayer structure and the correction region, by applying energy to a region of the multilayer structure corresponding to the detected correction region to react the thin films.

9. The method of claim 8, further comprising forming a hard mask layer over the light-shielding layer.

10. The method of claim 8, comprising forming the multilayer structure by controlling thicknesses of the thin films so that the transmittance of light transmitted through the multilayer structure is at least 50%.

11. The method of claim 8, comprising controlling transmittance of the multilayer structure by forming and oxidizing at least one of the thin films.

12. The method of claim 8, comprising forming the multilayer structure by stacking material layers selected from the group consisting of zirconium, gallium, indium, tin, titanium, aluminum, and bismuth.

13. The method of claim 8, comprising forming the compound by irradiating the multilayer structure with a laser beam or by applying thermal energy to the multilayer structure using a heat radiation plate.

14. The method of claim 13, comprising irradiating an upper face or a back side of the substrate with the laser beam.

15. A method for correcting a pattern critical dimension (CD) in a photomask, comprising:
    forming a multilayer structure over a substrate by stacking at least two thin films of which transmittance is varied by an energy source;
    forming a mask layer over the multilayer structure;
    forming a mask layer pattern that selectively exposes the multilayer structure by selectively etching the mask layer;
    detecting a correction region requiring a CD correction by measuring the CD of the mask layer pattern; and
    correcting the CD by a transmittance difference between the multilayer structure and the correction region, by selectively irradiating any one of the thin films included in the multilayer structure with a laser beam so that the transmittance of the portion of the multilayer structure corresponds to that of the detected correction region.

16. The method of claim 15, wherein the mask layer comprises a light-shielding layer or a phase-shift layer.

17. The method of claim 15, comprising forming the multilayer structure by stacking material layers selected from the group consisting of zirconium, gallium, indium, tin, titanium, aluminum, and bismuth.

18. The method of claim 15, comprising irradiating an upper face or a back side of the substrate with the laser beam.

* * * * *